(12) United States Patent
Song et al.

(10) Patent No.: US 8,607,120 B2
(45) Date of Patent: Dec. 10, 2013

(54) SEMICONDUCTOR MEMORY DEVICE FOR PERFORMING ADDITIONAL ECC CORRECTION ACCORDING TO CELL PATTERN AND ELECTRONIC SYSTEM INCLUDING THE SAME

(75) Inventors: Youngsun Song, Hwasung-si (KR); Ki Tae Park, Hwasung-si (KR)

(73) Assignee: Samsung Electronics Co., Ltd. (KR)

( * ) Notice: Subject to any disclaimer, the term of this patent is extended or adjusted under 35 U.S.C. 154(b) by 692 days.

(21) Appl. No.: 12/726,963

(22) Filed: Mar. 18, 2010

(65) Prior Publication Data

US 2010/0241929 A1      Sep. 23, 2010

(30) Foreign Application Priority Data

Mar. 19, 2009   (KR) .................. 10-2009-0023509

(51) Int. Cl.
   *G11C 29/00*       (2006.01)
(52) U.S. Cl.
   USPC ............................................. 714/763
(58) Field of Classification Search
   USPC ............................................. 714/763
   See application file for complete search history.

(56) References Cited

U.S. PATENT DOCUMENTS

| | | | |
|---|---|---|---|
| 6,502,218 B1* | 12/2002 | George et al. | 714/805 |
| 7,043,679 B1* | 5/2006 | Keltcher et al. | 714/763 |
| 7,096,406 B2* | 8/2006 | Kanazawa et al. | 714/763 |
| 8,001,441 B2* | 8/2011 | Brandman | 714/763 |
| 2006/0179362 A1* | 8/2006 | Alves et al. | 714/52 |
| 2007/0283214 A1* | 12/2007 | Lasser | 714/758 |
| 2010/0082885 A1* | 4/2010 | Litsyn et al. | 711/103 |
| 2010/0223525 A1* | 9/2010 | Wuu et al. | 714/755 |

FOREIGN PATENT DOCUMENTS

| | | |
|---|---|---|
| JP | 56-093191 | 7/1981 |
| JP | 05-189998 | 7/1993 |
| KR | 1020080064029 A | 7/2008 |

* cited by examiner

*Primary Examiner* — M. Mujtaba K Chaudry
*Assistant Examiner* — Enam Ahmed
(74) *Attorney, Agent, or Firm* — Myers Bigel Sibley & Sajovec, P.A.

(57) ABSTRACT

A semiconductor memory device for performing additional error correction code (ECC) correction according to a cell pattern and an electronic system including the same are provided. The semiconductor memory device includes a memory cell array configured to store user data; and an ECC engine configured to perform first ECC encoding on the user data, output a result of the first ECC encoding as ECC information, detect a predetermined cell pattern based on the user data, and additionally perform second ECC encoding on data of a cell corresponding to the predetermined cell pattern detected. Accordingly, data errors that may occur due to a certain cell pattern are prevented.

20 Claims, 11 Drawing Sheets

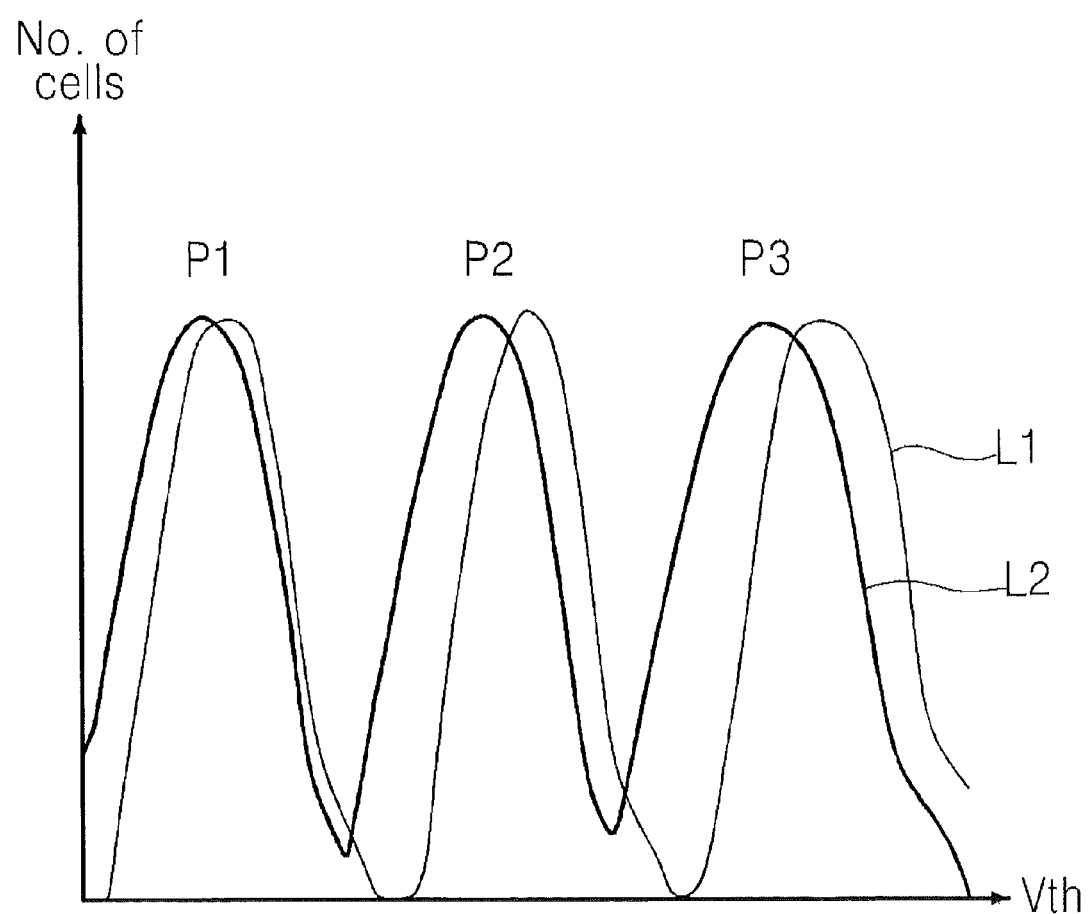

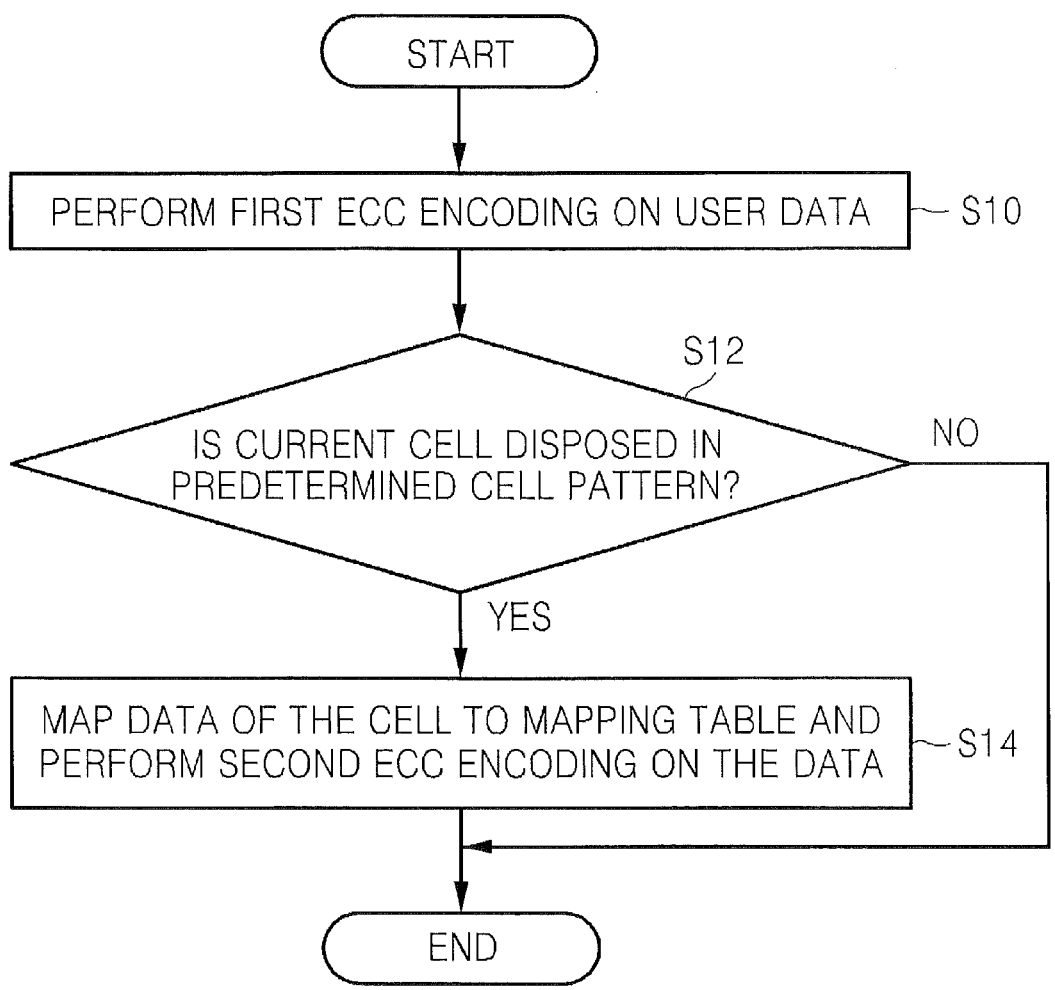

SEMICONDUCTOR MEMORY DEVICE FOR PERFORMING ADDITIONAL ECC CORRECTION ACCORDING TO CELL PATTERN AND ELECTRONIC SYSTEM INCLUDING THE SAME

REFERENCE TO PRIORITY APPLICATION

This application claims priority to Korean Patent Application No. 10-2009-0023509 filed Mar. 19, 2009, the contents of which are hereby incorporated herein by reference.

FIELD OF THE INVENTION

The invention relates to semiconductor memory devices and, more particularly, to semiconductor memory devices for performing additional error correction code (ECC) corrections according to cell patterns and electronic systems including the same.

BACKGROUND

Recently, studies on multi-level memory for storing multi-bit data in a single memory cell have been actively carried on in order to increase the density of integration for memory. A memory cell in the multi-level memory is capable of storing multiple bits. Such memory cell storing multiple bits is referred to as a multi-level cell (MLC) while a memory cell storing a single bit is referred to as a single-level cell (SLC). Since the MLC stores at least two bits, it has at least three data storage states (or cell states or states) and at least three threshold voltage distributions respectively corresponding to the states.

The threshold voltage distribution of an MLC may changes over time due to coupling with an adjacent cell, charge loss, and so on.

SUMMARY

Some embodiments of the present invention provide a semiconductor memory device for performing additional error correction code (ECC) correction according to a cell pattern and an electronic system including the same According to some embodiments of the present invention, there is provided a semiconductor memory device including a memory cell array configured to store user data; and an ECC engine configured to perform first ECC encoding on the user data, output a result of the first ECC encoding as ECC information, detect a predetermined cell pattern based on the user data, and additionally perform second ECC encoding on data of a cell corresponding to the predetermined cell pattern detected.

The ECC engine may map the data of the cell corresponding to the predetermined cell pattern detected to a mapping table before performing the second ECC encoding.

The ECC engine may perform first ECC decoding on the user data based on the ECC information to correct errors in bits and, when the user data includes the predetermined cell pattern, may perform second ECC decoding to correct errors in bits caused due to the predetermined cell pattern.

The number of bits subjected to error correction through the first ECC decoding may not be the same as the number of bits subjected to error correction through the second ECC decoding.

The number of bits subjected to the correction through the first ECC decoding may be less than the number of bits subjected to the correction through the second ECC decoding.

The predetermined cell pattern may be a disposition of a cell vulnerable to errors in the memory cell array.

The memory cell array may include a main area configured to store the user data and a spare area configured to store the ECC information.

The data undergone the second ECC encoding may be stored in the spare area of the memory cell array.

According to other embodiments of the present invention, there is provided an electronic system including a memory controller configured to control overall operation of the electronic system and a non-volatile memory device configured to store user data that has been processed or will be processed by the memory controller. The memory controller performs first ECC encoding on the user data, outputs a result of the first ECC encoding as ECC information, detects a predetermined cell pattern based on the user data, and additionally performs second ECC encoding on data of a cell corresponding to the predetermined cell pattern detected.

The memory controller may map the data of the cell corresponding to the predetermined cell pattern detected to a mapping table before performing the second ECC encoding.

BRIEF DESCRIPTION OF THE DRAWINGS

FIG. 2 is a graph showing a cell distribution, i.e., a threshold voltage distribution of 2-bit memory cells per state;

FIG. 9 is a flowchart of a method of performing error correction code (ECC) correction according to a cell pattern according to some embodiments of the present invention.

DETAILED DESCRIPTION OF THE EMBODIMENTS

Figure 1:
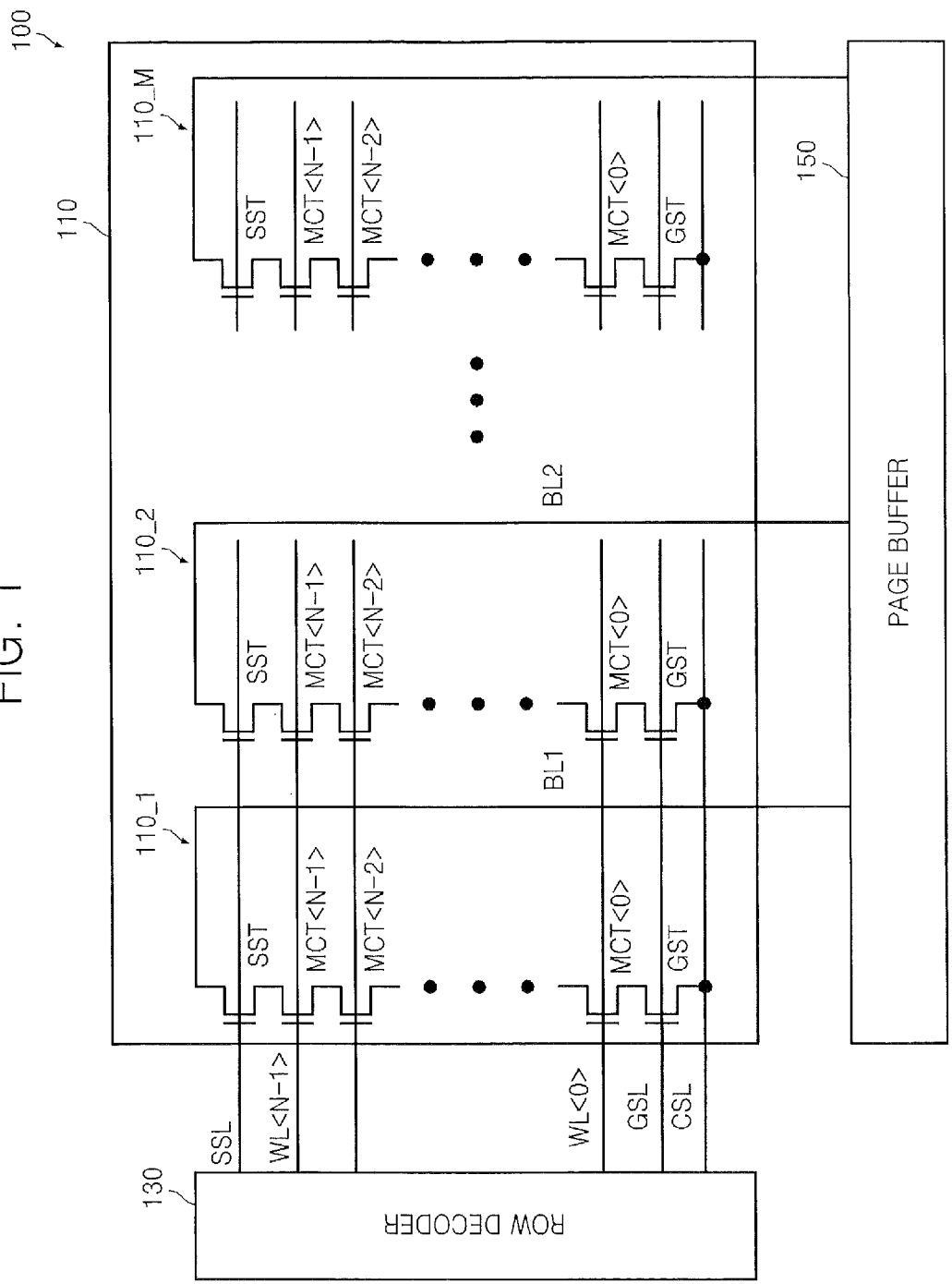
FIG. 1 is a block diagram of a non-volatile memory device according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a non-volatile memory device, and particularly of, a NAND flash memory device 100 according to some embodiments of the present inventive concept. The NAND flash memory device 100 includes a memory cell array 110, a row decoder 130, and a page buffer circuit 150.

The memory cell array 110 is divided into a plurality of memory blocks (not shown) each including a plurality of strings 110_1 through 110_M extending in a column direction. For clarity of the description, only a single memory block is illustrated in FIG. 1. Each of the strings 110_1 through 110_M includes a string selection transistor SST, a ground selection transistor GST, and a plurality of memory cell transistors MCT<0> through MCT<N−1> connected in series between the string selection transistor SST and the ground selection transistor GST. A gate of the string selection transistor SST is connected to a string selection line SSL and a drain thereof is connected to a corresponding bit line among a plurality of bit lines BL1 through BLM. A gate of the ground selection transistor GST is connected to a ground selection line GSL and a source thereof is connected to a common source line CSL. Control gates of the respective memory cell transistors MCT<0> through MCT<N−1> are respectively connected to word lines WL<0> through WL<N−1>.

The voltage level of the lines SSL, WL<0> through WL<N−1>, and GSL is controlled by the row decoder 130 in response to a predetermined timing control signal (not shown) and the voltage level of each of the bit lines BL1 through BLM is controlled by a page buffer (not shown) included in the page buffer circuit 150. Here, an operation of controlling the lines SSL, WL<0> through WL<N−1>, and GSL and an operation of controlling the bit lines BL1 through BLM are obvious to those of ordinary skill in the art, and a detailed description thereof will be thus omitted. Each of the memory cell transistors MCT<0> through MCT<N−1> in the memory cell array 110 is a multi-level cell storing data of multiple bits, i.e., at least two bits.

FIG. 2 is a graph showing a cell distribution, i.e., a threshold voltage distribution of 2-bit memory cells per state. In the graph illustrated in FIG. 2, the x-axis is a threshold voltage Vth and the y-axis is the number of cells per state. The 2-bit memory cells may have an erased state (not shown) and first through third programmed states P1 through P3.

In FIG. 2, a curve L1 indicates an initial cell distribution and a curve L2 indicates a cell distribution after time lapses. It can be inferred from the graph illustrated in FIG. 2 that the cell distribution shifts toward lower threshold voltages Vth over time due to charge loss. In particular, a cell state having a higher threshold voltage Vth induces more charge loss than a cell state having a lower threshold voltage Vth, and therefore, the higher the threshold voltage Vth, the greater the amount of shift.

Figure 3A:
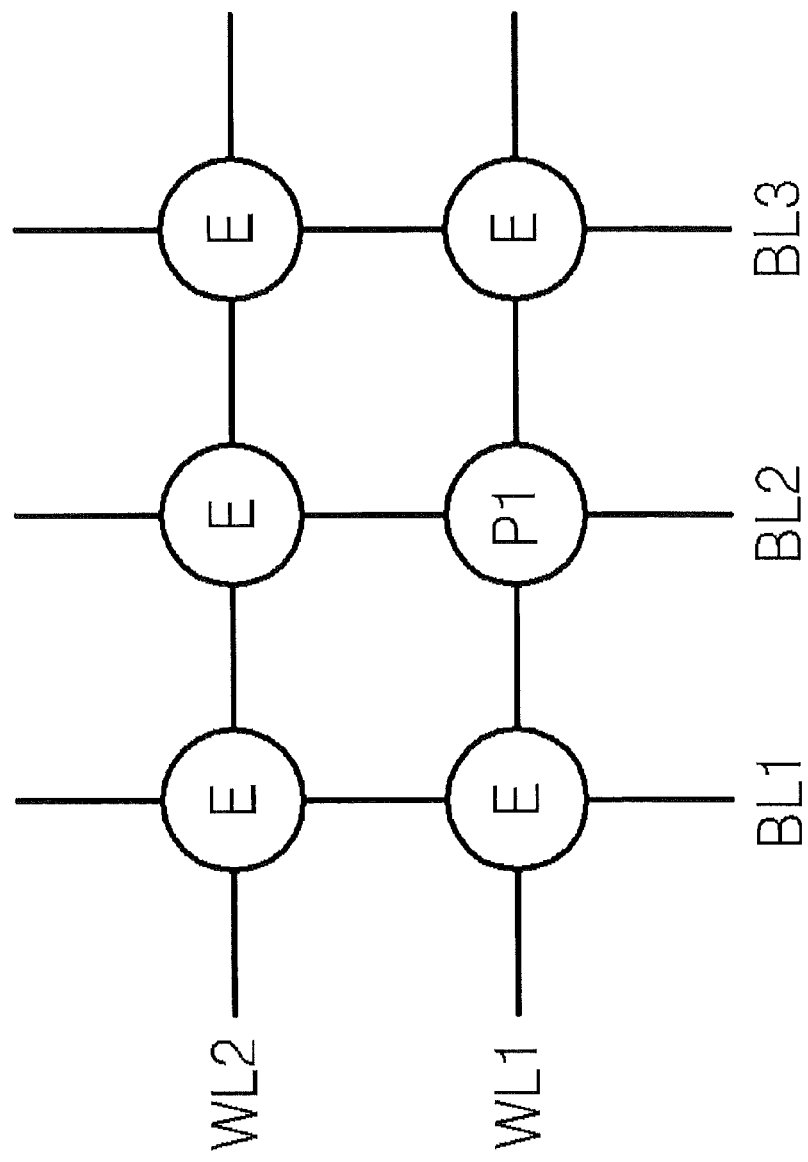
FIGS. 3A through 4B are diagrams for explaining a coupling effect caused by programming of an adjacent cell.
Figure 3B:
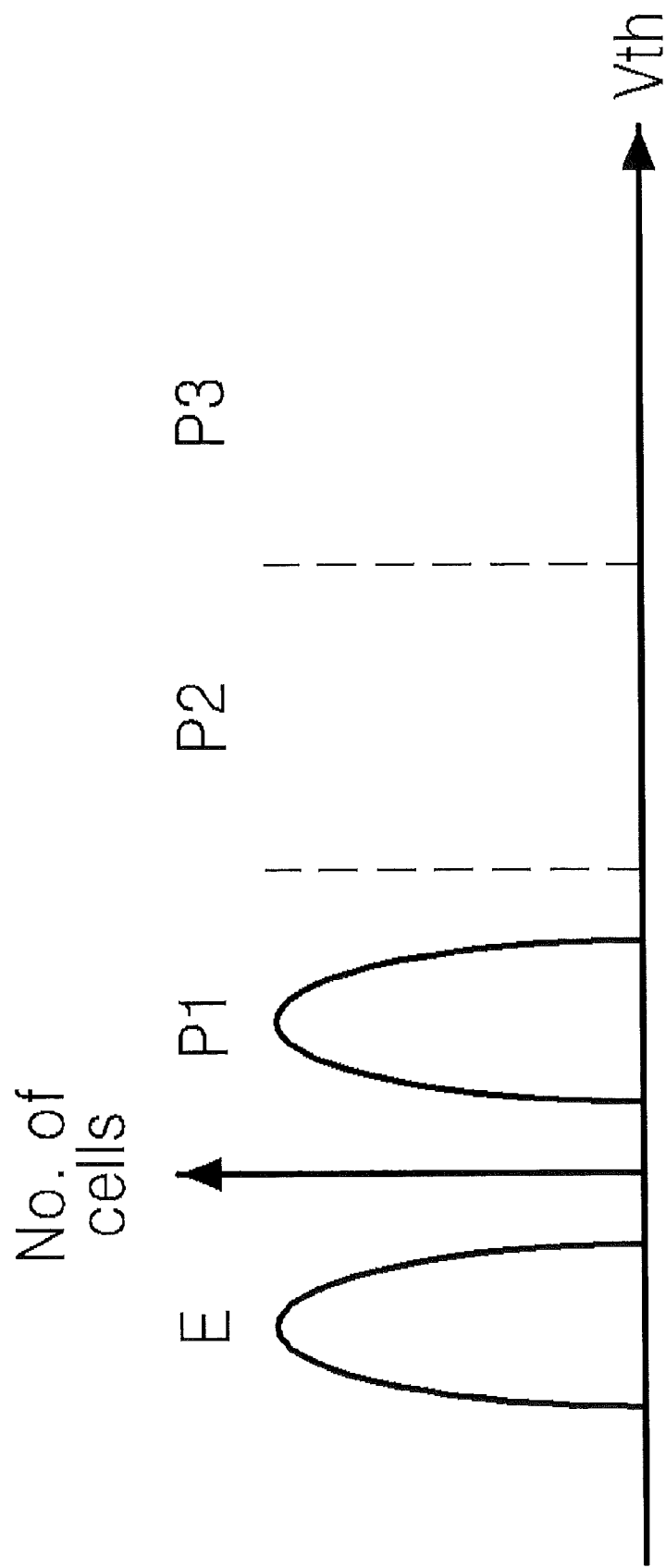

FIGS. 3A through 4B are diagrams for explaining a coupling effect caused by programming of an adjacent cell. FIG. 3A shows a case where a cell (hereinafter, referred to as a reference cell) at the intersection between the word line WL1 and the bit line BL2 has the first programmed state P1 and its adjacent cells, i.e., cells at the intersections among the word line WL1 and the bit lines BL1 and BL3 and cells at the intersections among the word line WL2 and the bit lines BL1 through BL3 have an erased state E. FIG. 3B shows a cell distribution corresponding to the case illustrated in FIG. 3A.

Figure 4A:
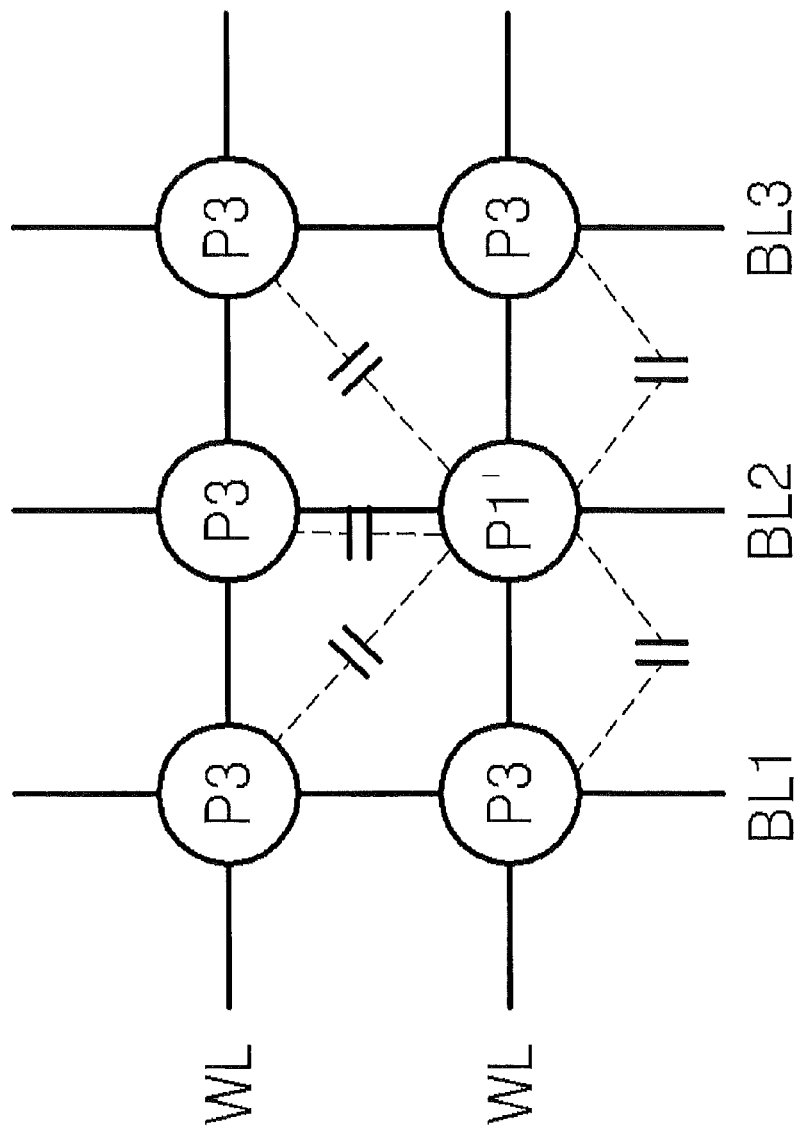

An assumption is made that the cells in the case illustrated in FIG. 3A are programmed as illustrated in FIG. 4A. In other words, let's assume that the cells adjacent to the reference cell having the first programmed state P1, i.e. cells at the intersections among the word line WL1 and the bit lines BL1 and BL3, and cells at the intersections among the word line WL2 and the bit lines BL1 through BL3 are all programmed to the third programmed state P3. Capacitors illustrated in FIG. 4A are modeled to show the coupling effect between the reference cell and the adjacent cells.

Figure 4B:
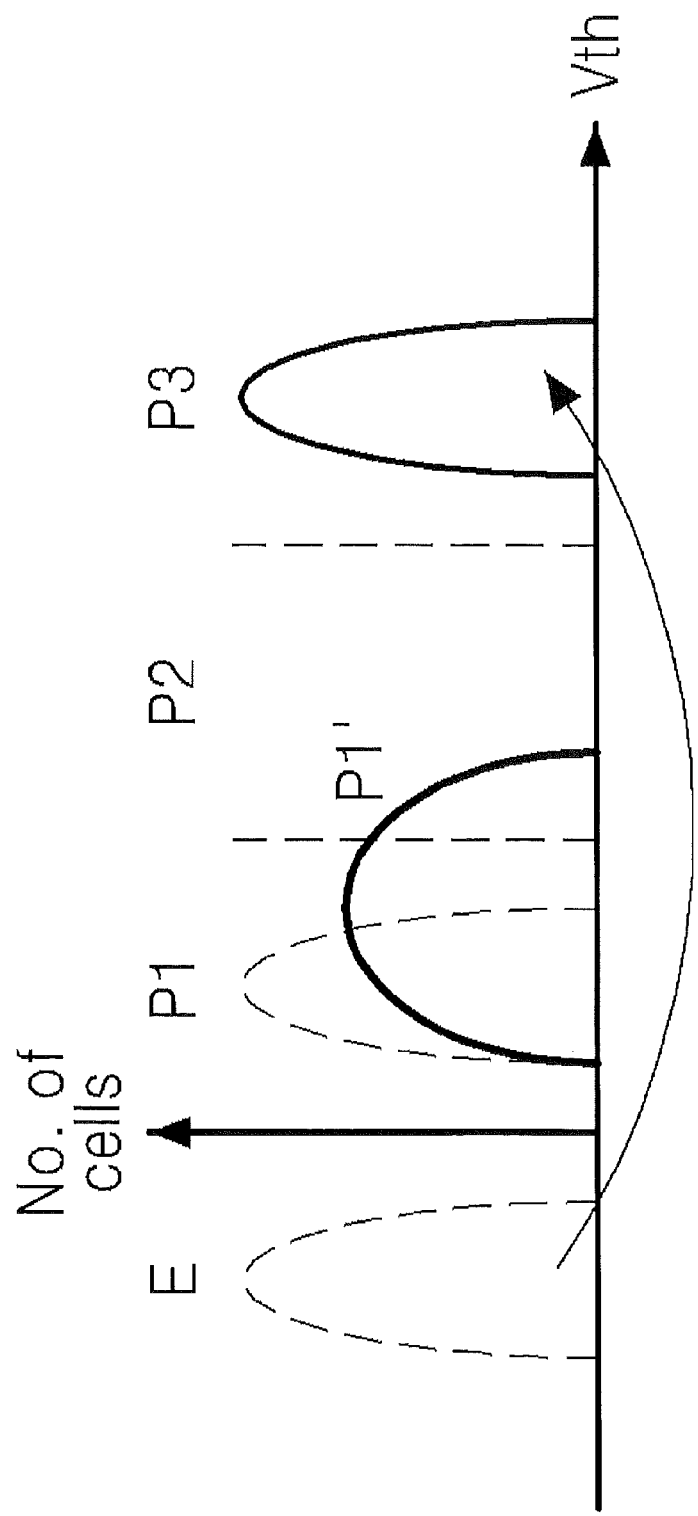

When the adjacent cells are programmed to the third programmed state P3, as illustrated in FIG. 4A, a cell distribution may be represented by the graph illustrated in FIG. 4B. Referring to FIG. 4B, when the adjacent cells are programmed from the erased state E to the third programmed state P3, the reference cell in the first programmed state P1 becomes to have a shifted distribution P1' due to the coupling effect. In other words, a threshold voltage distribution shifts from "P1" to "P1'" due to coupling disturb.

In other words, when a reference cell and its adjacent cells are programmed in a certain pattern, e.g., P3-P1-P3, a state stored in the reference cell may be changed due to the coupling effect.

Figure 5:
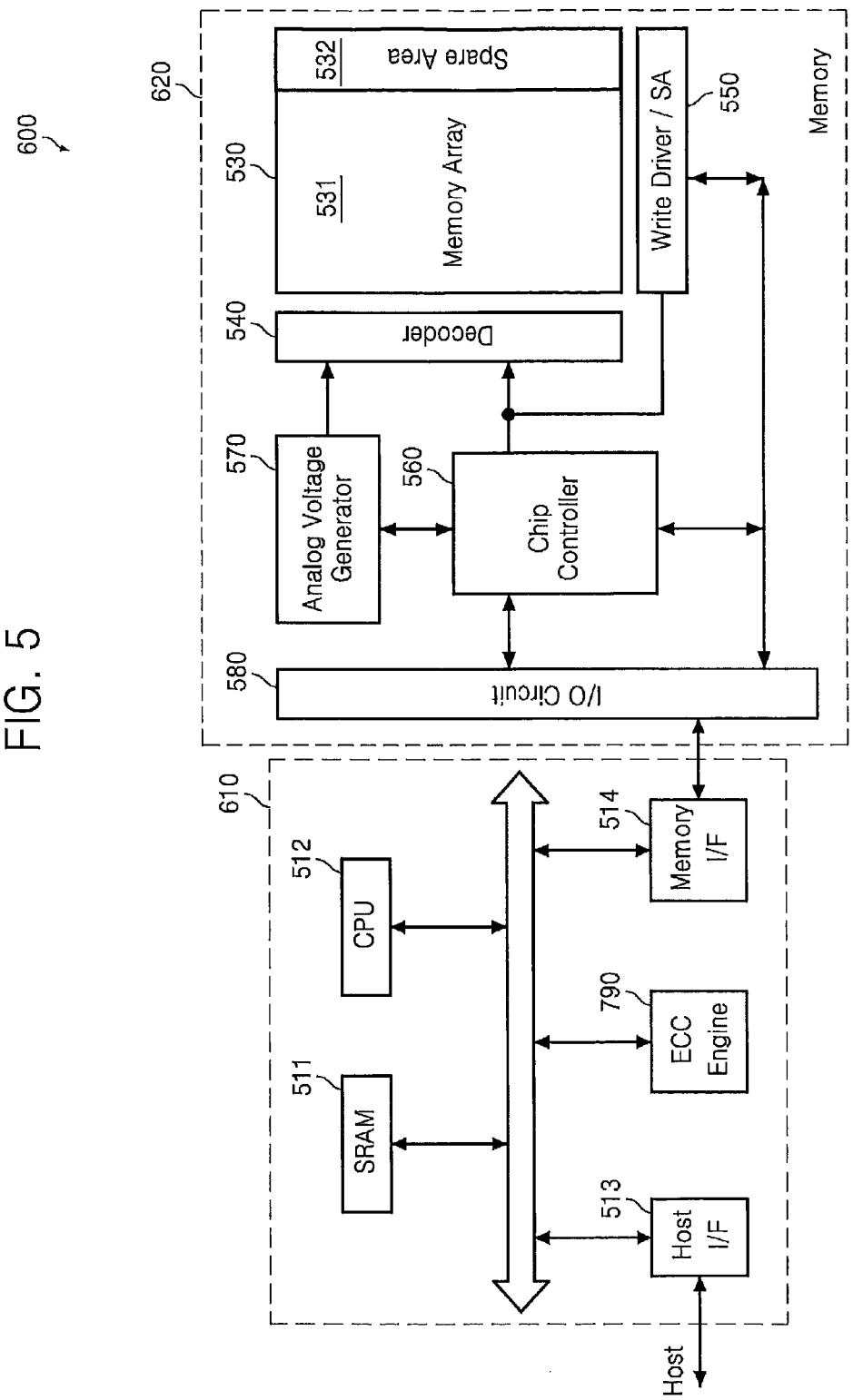
FIG. 5 is a block diagram of a non-volatile memory system according to some embodiments of the present invention.

FIG. 5 is a block diagram of a non-volatile memory system 600 according to some embodiments of the present invention. The non-volatile memory system 600 includes a non-volatile memory device 620 and a memory controller 610 controlling the non-volatile memory device 620.

The non-volatile memory device 620 includes a memory cell array 530, a decoder 540, a write driver/sense amplifier (SA) circuit 550, a chip controller 560, a voltage generator 570, and an input/output (I/O) circuit 580.

The memory cell array 530 includes a main area 531 and a spare area 532. The main area 531 is used to store user data and is thus referred to as a user data area. The spare area 532 is used to store error correction code (ECC) information. The structure and the operations of the memory cell array 530 may be similar to those of the memory cell array 110 illustrated in FIG. 1 when the memory cell array 100 corresponds to NAND type memory cell array.

The decoder 540 may select a word line from among a plurality of word lines in response to row addresses and supply a first operating voltage to the selected word line and a second operating voltage to respective non-selected word lines. For instance, in a programming mode, the decoder 540 may supply the first operating voltage, e.g., a program voltage, to the selected word line and the second operating voltage, e.g., a pass voltage, to the respective non-selected word lines. The program voltage may be 15 to 20 V and the pass voltage may be 10 V. In a reading mode, the decoder 540 may supply the first operating voltage, e.g., a ground voltage, to the selected word line and the second operating voltage, e.g., a read voltage, to the respective non-selected word lines. The read voltage may be 4.5 V. The program voltage is higher than the pass voltage. The pass voltage is higher than the read voltage.

The write driver/SA circuit 550 is selectively connected with a plurality of bit lines and writes (or programs) data to selected memory cells or senses and amplifies data from the selected memory cells to read the data. The write driver/SA circuit 550 may include a plurality of data storage units (not shown) for storing a data set to be programmed in the programming mode and for storing a data set read from memory cells in the reading mode. Each of the data storage units may be implemented using a plurality of latches. The data storage units may also store a data set read from memory cells in a program verify mode.

A switching block (not shown) may also be provided between the write driver/SA circuit 550 and the memory cell array 530 to selectively connect a write driver or an SA to the a plurality of bit lines.

The chip controller 560 outputs internal control signals (not shown) for controlling operations (e.g., a program operation, an erase operation, and a read operation) of the non-volatile memory device 620 in response to external commands. The voltage generator 570 generates voltages, e.g., the program voltage, the pass voltage, and the read voltage, necessary for the operations of the non-volatile memory device 620.

The I/O circuit 580 interfaces the non-volatile memory device 620 with an external device, e.g., the memory controller 610. In detail, the I/O circuit 580 may receive commands and data to be programmed from the external device and transmits a state signal and data read from the memory cell array 530 to the external device.

The memory controller 610 controls data communication between the host and the non-volatile memory device 620. For instance, the memory controller 610 controls the non-volatile memory device 620 to write or read data in compliance with the host.

The non-volatile memory system 600 illustrated in FIG. 5 may be a memory card.

The memory controller 610 includes a static random access memory (SRAM) 511, a central processing unit (CPU) 512, a host interface (I/F) 513, a memory I/F 514, and an ECC engine 790. The SRAM 511 is used as an operating memory for the CPU 512. The host I/F 513 is equipped with a data communication protocol of the host connected with the memory card 600. The memory I/F 514 interfaces with the non-volatile memory device 620. The CPU 512 performs general control operations to write data to and/or read data from the non-volatile memory device 620. Although not shown, it would be apparent to those of ordinary skill in the art that the non-volatile memory system 600 may also include read-only memory (ROM) which stores code data used for the interface with the host.

The ECC engine 790 performs first ECC encoding on user data and outputs a result of the first ECC encoding as ECC information. At this time, the ECC engine 790 detects a predetermined cell pattern based on the user data and additionally performs second ECC encoding on cell data corresponding to the predetermined cell pattern detected. The ECC information may be stored in the spare area 532 of the memory cell array 530. The first ECC encoding and the second ECC encoding may be the same error correction algorithm.

Figure 6:
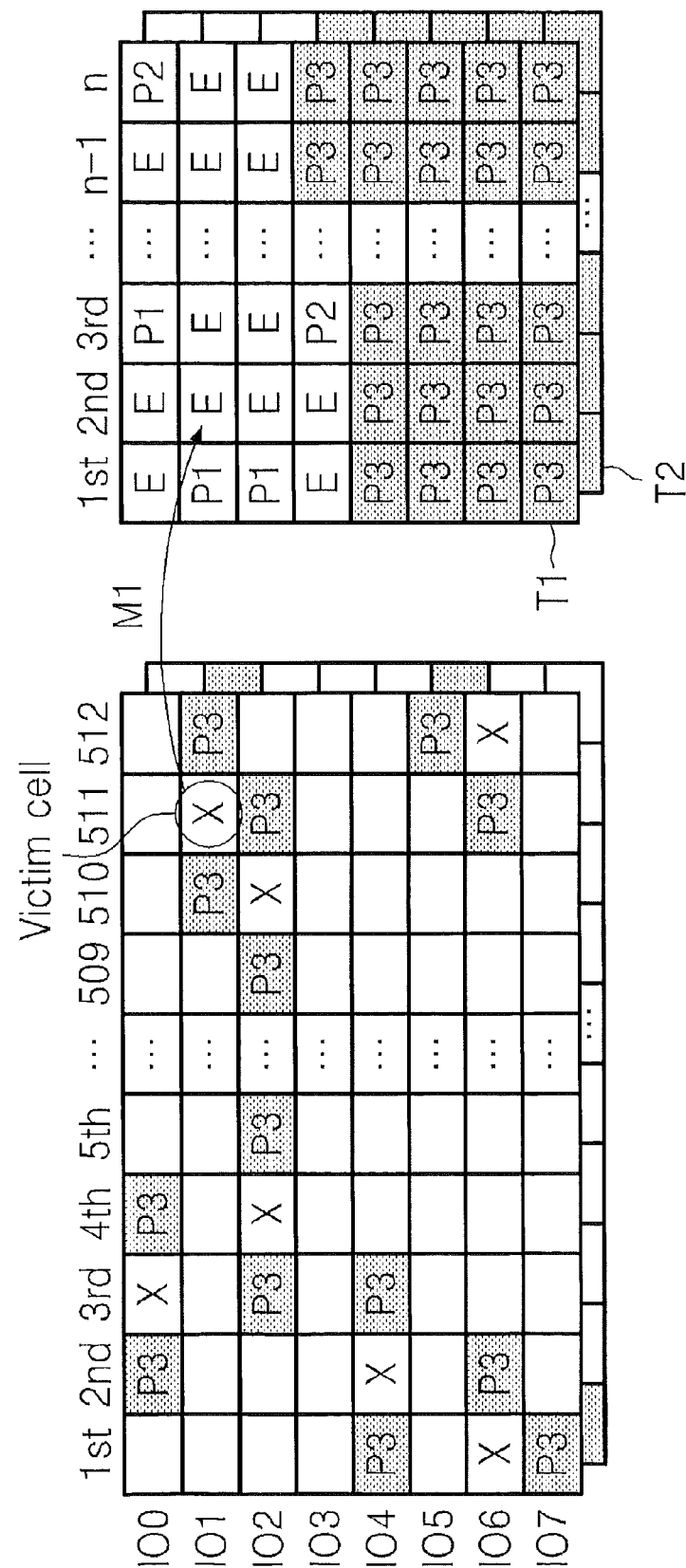
FIGS. 6 and 7 are diagrams for explaining a procedure in which the non-volatile memory system illustrated in FIG. 5 maps data corresponding to a certain pattern according to some embodiments of the present invention.

The predetermined cell pattern is the disposition of a cell vulnerable to errors in the memory cell array 530. For instance, if a cell, e.g., a victim cell illustrated in FIG. 6, is located between cells in a first state, e.g., the third programmed state P3 ( ) in the memory cell array 530, an error may occur when data is read from the victim cell. In detail, if a cell, e.g., a victim cell in FIG. 6, that stores data corresponding to the first state (e.g., the third programmed state P3), a second state (e.g., the second programmed state P2), or a third state (e.g., the erased state E) is located between cells in the first state, i.e., the third programmed state P3, an error may occur when data is stored in or read from the victim cell due to coupling effect between adjacent cells.

To prevent such error occurrence, when the ECC engine 790 detects that a cell is disposed in the predetermined cell pattern, that is, a cell in a predetermined program state, e.g., the second or third programmed state P2 or P3 or the erased state E is disposed between two cells in the third programmed state P3 in the memory cell array 530 based on the user data, the ECC engine 790 performs additional ECC encoding on the data of the cell, i.e., the victim cell, disposed in the predetermined cell pattern. Consequently, errors are prevented from occurring in data of cells vulnerable due to cell arrangement by the ECC engine 790 performing additional ECC encoding in the NAND flash memory device 100.

Before performing the second ECC encoding, the ECC engine 790 may map cell data corresponding to the predetermined cell pattern to a mapping table T1 and/or T2 (FIG. 6). Data that has undergone the second ECC encoding by the ECC engine 790 may be stored in the spare area 532 of the memory cell array 530.

FIG. 6 is a diagram for explaining a procedure in which the non-volatile memory system 600 illustrated in FIG. 5 maps data corresponding to a certain pattern according to some embodiments of the present invention. When cell arrangement in the memory cell array 530 has a predetermined cell pattern, for example, a cell in the third programmed state P3—a cell in a predetermined program state, e.g., the second or third programmed state P2 or P3 or the erased state E—a cell in the third programmed state P3, the ECC engine 790 maps data corresponding to the predetermined program state to a particular address in at least one of the mapping tables T1 and T2 as shown by M1 and then performs additional ECC encoding on the data.

Figure 7:
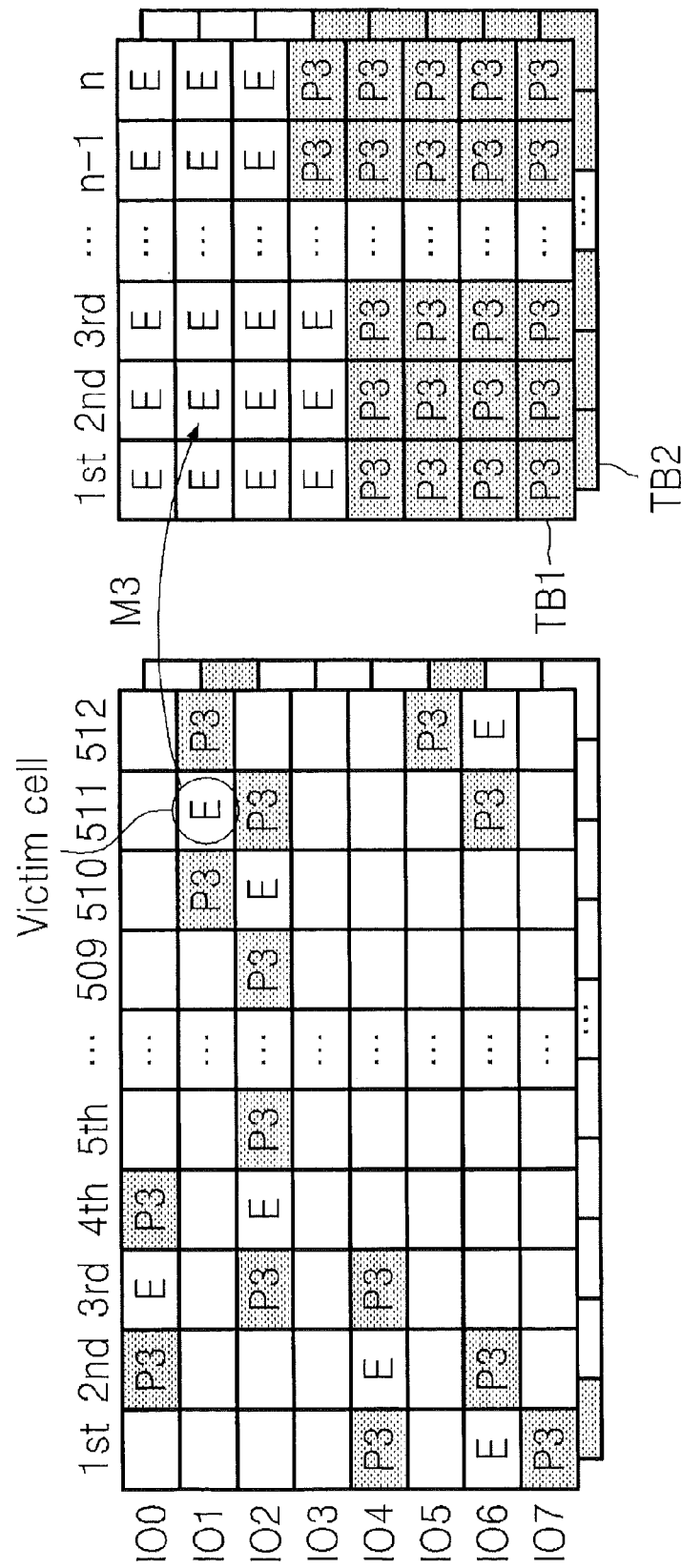

FIG. 7 is a diagram for explaining a procedure in which the non-volatile memory system 600 illustrated in FIG. 5 maps data corresponding to a certain pattern according to other embodiments of the present invention. When cell arrangement in the memory cell array 530 has a predetermined cell pattern, for example, a cell in the third programmed state P3—a cell in the erased state E—a cell in the third programmed state P3, the ECC engine 790 maps data corresponding to the erased state E to a particular address in at least one mapping table TB1 or TB2 as shown by M3 and then performs additional ECC encoding on the data. In other words, only when data of the cell located in the predetermined cell pattern, i.e., the reference cell corresponds to the erased state E, the ECC engine 790 maps the data corresponding to the erased state E to the particular address in at least one of the mapping tables TB1 and TB2 and then performs additional ECC encoding on the data.

The ECC engine 790 may also perform first ECC decoding on user data based on ECC information and correct errors in bits. When the user data includes the predetermined cell pattern, the ECC engine 790 may also perform second ECC decoding and correct errors in bits caused due to the predetermined cell pattern. The first ECC decoding and the second ECC decoding may be the same error correction algorithm. At this time, the number of bits subjected to error correction through the first ECC decoding may not be the same as the number of bits subjected to error correction through the second ECC decoding. The number of bits subjected to the correction through the first ECC decoding may be less than the number of bits subjected to the correction through the second ECC decoding.

When the number of bits subjected to ECC correction is limited and a cell is disposed in a vulnerable pattern (e.g., a cell in the third programmed state P3—a cell in the erased state E—a cell in the third programmed state P3) in the memory cell array 530, the ECC engine 790 enhances ECC correction on the cell corresponding to the vulnerable pattern, i.e., the cell in the erased state E, thereby increasing an error correction range compared to conventional ECC correction.

Consequently, the ECC engine 790 of the NAND flash memory device 100 increases the proportion of data of cells subjected to correction through ECC decoding on data of cells vulnerable according to a certain cell pattern compared to data of cells subjected to correction through normal ECC decoding, thereby effectively preventing errors from occurring in data of cells vulnerable in the certain cell pattern.

Figure 8:
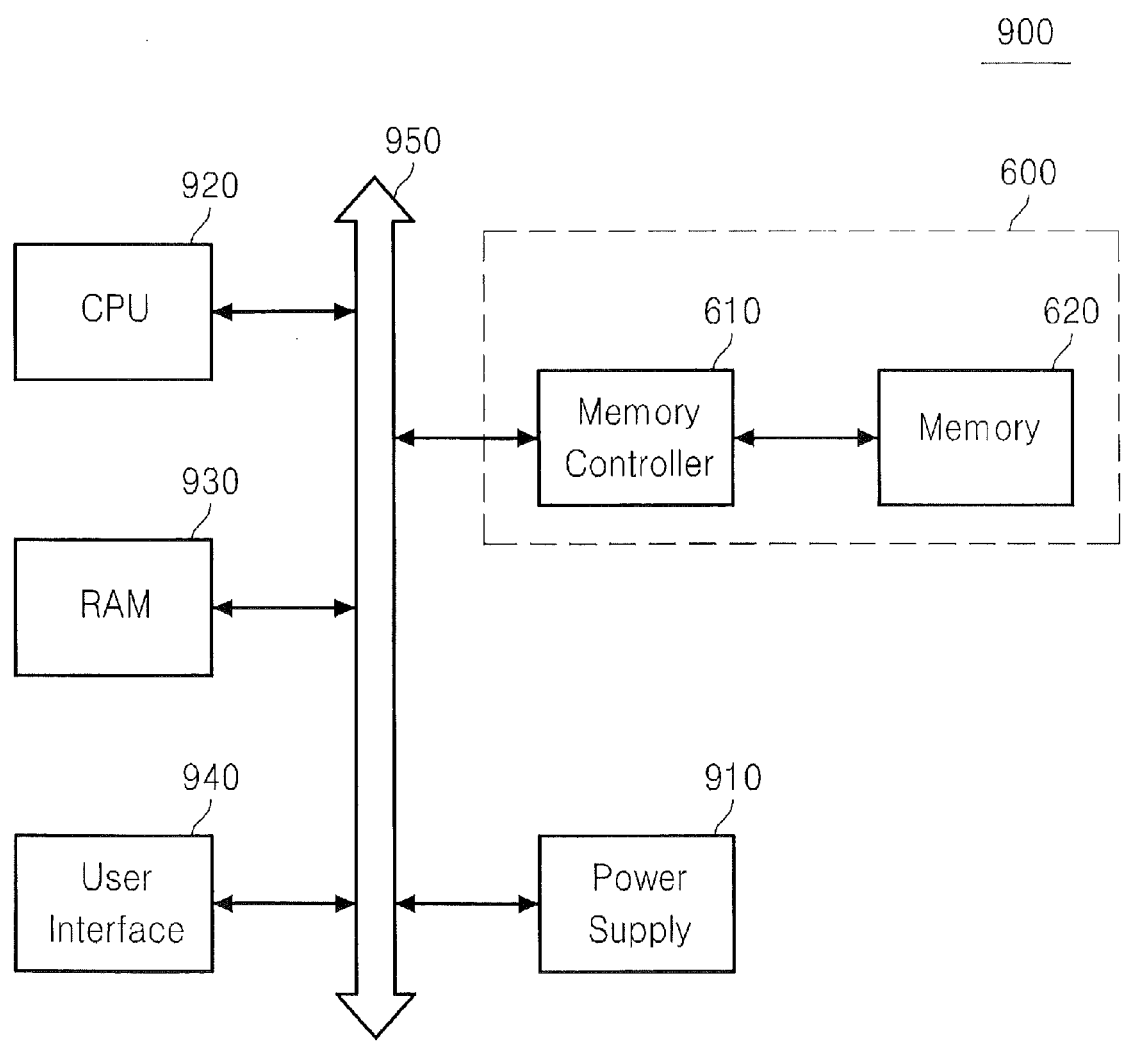
FIG. 8 is a block diagram of an electronic system according to some embodiments of the present invention.

FIG. 8 is a block diagram of an electronic system 900 according to an exemplary embodiment of the present invention. The non-volatile memory device 620 or the memory system 600 according to an exemplary embodiment of the present inventive concept may be embedded in the electronic system such as mobile devices, laptop computers, or desktop computers.

Referring to FIG. 8, the electronic system 900 according to the present exemplary embodiment may include a nonvolatile memory system 600, a power supply 910, a central processing unit (CPU) 920, a RAM 930, a user interface 940, and a system bus 950 electrically connecting these elements.

The CPU 920 controls the overall operation of the electronic system 900. The RAM 930 stores information needed for the operation of the electronic system 900. The user interface 940 provides an interface between the electronic system 900 and a user. The power supply 910 supplies electric power to the internal constituent elements such as the CPU 920, the RAM 930, the user interface 940, and the nonvolatile memory system 600.

The flash memory 620 stores the N-bit data, where N is 1 or an integer greater than 1, that is provided through the user interface 940 or processed or will be processed by the CPU 920, via the memory controller 610.

The memory system 600 according to an exemplary embodiment of the present inventive concept is as described above. A detailed description thereof will be thus omitted.

Although the memory device 620 and the memory controller 610 may together constitute a single memory card, the memory device 620 and the memory controller 610 may be separately embodied. The memory controller and the flash memory may constitute, for example, a solid state drive/disk (SSD) using a non-volatile memory for storing data. The memory controller 610 may be embodied in a host.

Although it is not illustrated in the drawings, the electronic system 900 may be further provided with application chipsets, camera image processors (CISs), or mobile DRAMs, which is well known to one skilled in the art to which the present inventive concept pertains.

FIG. 9 is a flowchart of a method of performing ECC correction according to a cell pattern according to some embodiments of the present invention. Referring to FIGS. 5 and 9, the ECC engine 790 performs first ECC encoding on user data stored in the memory cell array 530 and outputs a result of the first ECC encoding as ECC information in operation S10. The ECC engine 790 determines whether a current cell is disposed in a predetermined cell pattern based on the user data in operation S12. When it is determined that the cell is disposed in the predetermined cell pattern, the ECC engine 790 maps data of the cell to a mapping table and additionally performs second ECC decoding on the data in operation S14.

As described above, according to some embodiments of the present invention, additional ECC encoding is performed according to a certain cell pattern, thereby preventing errors from occurring in data of cells vulnerable in the certain cell pattern. As a result, reliability is increased in a non-volatile memory device and an electronic system including the same.

The present inventive concept can be embodied in hardware, software, firmware or combination thereof. When the method is embodied in software, it can be embodied as computer readable codes or programs on a computer readable recording medium. The computer readable recording medium is any data storage device that can store data which can be thereafter read by a computer system. Examples of the computer readable recording medium may includes read-only memory (ROM), random-access memory (RAM), electrically erasable programmable ROM (EEPROM), and flash memory.

While the present invention has been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. A memory system; comprising:
a nonvolatile memory device; and
a memory controller electrically coupled to said nonvolatile memory device, said memory controller comprising an error correction code (ECC) generation circuit configured to generate a first ECC code associated with first data written into said nonvolatile memory device and further configured to generate a second ECC code associated with a first portion of the first data in response to detecting a first data pattern within the first data;
wherein said memory controller is configured to write the first and second ECC codes into said nonvolatile memory device along with writing the first data into said nonvolatile memory device; and
wherein said memory controller is further configured to decode the first data when read from said nonvolatile memory device using the first and second ECC codes to detect at least one error in the first data.

2. The memory system of claim 1, wherein said memory controller is configured to write the first and second ECC codes into a spare portion of said nonvolatile memory device.

3. The memory system of claim 1, wherein the first and second ECC codes are unequal ECC codes derived from different data.

4. The memory system of claim 3, wherein the first and second ECC codes are generated using an equivalent ECC code algorithm.

5. The memory system of claim 1, wherein said memory controller is further configured to write the first portion of the first data into a spare portion of said nonvolatile memory device.

6. The memory system of claim 1, wherein the first data pattern is a multi-bit data pattern that is more susceptible to errors when written into said nonvolatile memory device by virtue of cell-to-cell program coupling relative to other equivalent length data patterns.

7. The memory system of claim 6, wherein said memory controller is further configured to write data within the first portion of the first data into a mapping table within the memory system in advance of generating the second ECC code.

8. A memory system, comprising:
a nonvolatile memory device; and
a memory controller electrically coupled to said nonvolatile memory device, said memory controller comprising an error correction code (ECC) generation circuit configured to generate a first ECC code associated with first data written into said nonvolatile memory device and further configured to generate a second ECC code associated with a first portion of the first data in response to detecting a first data pattern within the first data; and
wherein said memory controller is further configured to write data within the first portion of the first data into a mapping table within the memory system in advance of generating the second ECC code and writing the second ECC code into the nonvolatile memory device.

9. A semiconductor memory device comprising:
a memory cell array configured to store user data; and
an error correction code (ECC) engine configured to perform first ECC encoding on the user data, output a result of the first ECC encoding as ECC information, detect a predetermined cell pattern based on the user data, and additionally perform second ECC encoding on data of a cell corresponding to the predetermined cell pattern detected,
wherein the error correction code (ECC) engine is further configured to decode the user data when read from said memory cell array using the result of the first and second ECC encoding to detect at least one error in the user data read from said memory cell array.

10. The semiconductor memory device of claim 9, wherein the ECC engine maps the data of the cell corresponding to the predetermined cell pattern detected to a mapping table before performing the second ECC encoding.

11. The semiconductor memory device of claim 9, wherein the ECC engine performs first ECC decoding on the user data based on the ECC information to correct errors in bits and, when the user data comprises the predetermined cell pattern, performs second ECC decoding to correct errors in bits caused due to the predetermined cell pattern.

12. The semiconductor memory device of claim 11, wherein the number of bits subjected to error correction through the first ECC decoding is not the same as the number of bits subjected to error correction through the second ECC decoding.

13. The semiconductor memory device of claim 12, wherein the number of bits subjected to the correction through the first ECC decoding is less than the number of bits subjected to the correction through the second ECC decoding.

14. The semiconductor memory device of claim 9, wherein the predetermined cell pattern is a disposition of a cell vulnerable to errors in the memory cell array.

15. The semiconductor memory device of claim 9, wherein the memory cell array comprises a main area configured to store the user data and a spare area configured to store the ECC information.

16. The semiconductor memory device of claim 15, wherein the data undergoing the second ECC encoding is stored in the spare area of the memory cell array.

17. The memory system of claim 1, wherein the ECC generation circuit is further configured to:
store the first ECC code into said nonvolatile memory device;
store a copy of victim data within the first data that is more vulnerable to errors relative to other data within the first data into a mapping table within the nonvolatile memory device;
generate and store the second ECC code associated with the victim data within the nonvolatile memory device; and
perform an error detection operation on the first data in response to reading the first data, the victim data and the first and second ECC codes from the nonvolatile memory device.

18. The memory system of claim 1, wherein the first portion of the first data has a higher susceptibility of error relative to at least another portion of the first data; and wherein the first and second ECC codes are unequal ECC codes derived from different portions of the first data.

19. The memory system of claim 8, wherein the first portion of the first data has a higher susceptibility of error relative to at least another portion of the first data.

20. The memory system of claim 9, wherein said ECC engine is configured to detect the predetermined cell pattern based on a first portion of the user data having a higher susceptibility of error relative to another portion of the user data; and wherein the first and second ECC encoding applies to different portions of the user data.

* * * * *